United States Patent
Tsukagoshi et al.

Patent Number: 6,113,728
Date of Patent: Sep. 5, 2000

[54] PROCESS FOR CONNECTING CIRCUITS AND ADHESIVE FILM USED THEREFOR

[75] Inventors: Isao Tsukagoshi, Shimodate; Yutaka Yamaguchi, Yuki; Atsuo Nakajima, Ibaraki-ken; Yasushi Goto, Shimodate, all of Japan

[73] Assignee: Hitachi Chemical Company, Ltd., Tokyo, Japan

[21] Appl. No.: 08/464,118

[22] Filed: Jun. 5, 1995

Related U.S. Application Data

[62] Division of application No. 07/853,868, Mar. 20, 1992, Pat. No. 5,843,251, which is a continuation of application No. 07/490,915, Mar. 9, 1990, abandoned.

[30] Foreign Application Priority Data

Mar. 9, 1989 [JP] Japan ................................. 1-056771
Mar. 22, 1989 [JP] Japan ................................. 1-069973

[51] Int. Cl.$^7$ ................. B32B 31/00; C09J 5/10
[52] U.S. Cl. ............ 156/264; 29/832; 156/281; 156/305; 156/306.9; 156/330; 437/183; 523/206; 523/211; 525/523

[58] Field of Search ............... 156/306.9, 330, 156/264, 64, 256, 281, 295, 305; 264/344; 29/832; 523/206, 211; 525/523; 437/212, 226, 183

[56] References Cited

U.S. PATENT DOCUMENTS

| | | | |
|---|---|---|---|
| 3,167,602 | 1/1965 | Bentov et al. | 264/4 |
| 3,600,246 | 8/1971 | Breen | 156/330 |
| 3,741,858 | 6/1973 | Fujiwara et al. | 156/330 |
| 3,811,183 | 5/1974 | Celling | 156/330 |
| 4,617,357 | 10/1986 | Pallie et al. | 525/523 |
| 4,749,120 | 6/1988 | Hatada | 156/295 |

*Primary Examiner*—John J. Gallagher
*Attorney, Agent, or Firm*—Antonelli, Terry, Stout & Kraus, LLP

[57] ABSTRACT

An adhesive film comprising (a) a liquid epoxy resin, (b) a solid resin having one or more functional groups, (c) a microcapsule type curing agent, and if necessary (d) a coupling agent, is effective for connecting semiconductor chips and wiring boards under heat and pressure.

3 Claims, 3 Drawing Sheets

PROCESS FOR CONNECTING CIRCUITS AND ADHESIVE FILM USED THEREFOR

This application is a Divisional application of Ser. No. 07/853,868 filed Mar. 20, 1992 now U.S. Pat. No. 5,843,251, which application is a Continuation application of Ser. No. 07/490,915, filed Mar. 9, 1990, now abandoned.

BACKGROUND OF THE INVENTION

This invention relates to a process for connecting semiconductor chips to circuits on a substrate and an adhesive film used therefor.

As a method for attaching semiconductor chips having electrodes projecting from the main face (such as IC's with bumps) to a wiring substrate, it is known to apply an adhesive between the electrodes of semiconductor chips and the substrate surface where the corresponding circuit terminals are formed, and the IC chips and wiring substrate are pressed against each other so that the electrodes of the IC chips and the wiring substrate will become conductive and be bonded to each other. Regarding the adhesive used for the above purpose, there are a case where an anisotropic electroconductive adhesive prepared by mixing electroconductive particles in an insulating adhesive is used and a case where an insulating adhesive is used.

Anisotropic electroconductive adhesives have a problem in the retention of insulating performance since there may occur short-circuiting due to the presence of electroconductive particles between the adjoining circuits when, for instance, connecting high-density circuits. Also, since the electroconductive particles are generally hard, this type of adhesive involves problems of possible cracking of IC chips in the pressing step at the time of connection and a tendency to cause a rupture in the wiring protective coat.

Regarding a procedure for the application of an insulating adhesive, there is known, for instance, a method in which a low-viscosity curing adhesive such as an ultraviolet-curing type adhesive is applied on the circuits and these circuits are contacted with each other through fine unevenness on the circuit surfaces by pressing at the time of connection to thereby effect desired electrical connection, and then the adhesive is cured to complete the connection and bonding, with the superfluous portion of adhesive being removed out of the circuits (see, for example, Japanese Patent Publication No. 46-43732, and NIKKEI MICRO-DEVICES, June, 1987, issue, page 65, Nikkei McGraw-Hill).

Among these types of adhesives, those made of thermoplastic materials are simple in use for connection but unsatisfactory in heat resistance and connection reliability. Attention is therefore paid to the curing type adhesives.

Curing of adhesive has been generally performed by applying a form of energy such as heat and light (ultraviolet rays, electron rays, etc.). In the case of heat curing, it can be effected by heating and pressing the adhesive between hot plates. In the case of ultraviolet-curing, a transparent plate such as glass plate is used as one of the pressing plates and ultraviolet rays are applied through the transparent plate.

Practical use of said conventional types of adhesives has the problems such as pointed out below.

(1) Because of wide variety in height of projecting electrodes from the main face, a high connection reliability can not be obtained.

The number of projecting electrodes per chip may vary from 10 to as much as 500, and the height of these electrodes is usually in the range of about 1 to 50 $\mu$m. It is difficult to form such a large number of electrodes with uniform height, for example, with a scatter of less than 0.5 $\mu$m in height. When the height of projecting electrodes is non-uniform, although the electrodes with a large height can easily contact the circuit surface on the substrate, the electrodes with a low height may fail to reach the circuit surface to form a space therebetween, making it unable to obtain an electroconductive connection.

(2) With the method of the type in which a liquid adhesive is applied on the electrodes, it is difficult to control the coated adhesive thickness uniformly, and there may take place such a phenomenon as shortage of adhesive at the connecting portion or generation of air cells, resulting in unsatisfactory connection reliability.

Further, in this type of method, the adhesive used needs to be liquid with low viscosity for the operational reason. Therefore, the adhesive used in this method is usually prepared by using a low-molecular weight material and subjecting it to a curing reaction to turn it into a high-molecular weight substance, or by diluting a high-molecular weight material with a solvent or the like.

In the case of the former method, since a low-molecular weight material is suddenly turned into a high-molecular weight substance, there takes place an excess degree of cure shrinkage, which generates a residual stress at the connecting portion to make its thermal impact resistance unsatisfactory. In the case of latter method, there arises the problem of environmental pollution as the solvent is dried away. Also, the residual solvent is gasified when heat and pressure are applied at the time of connection, causing generation of air cells. It is thus impossible with these methods to obtain satisfactory connection reliability.

(3) When viewed from the adhesive curing system, the ultraviolet-curing method is subject to restriction on the type of substrate employed because the substrate used in this method must be permeable to ultraviolet rays.

It is hardly possible with the heat-curing method to satisfy the two antithetic property requirements, namely keeping quality and quick curing property at the same time. For instance, this method is very poor in performance of such operations as curing by long-time heating under pressure or short-time coating by mixing a curing agent just before use.

In the case of the method using a thermo-plastic material, there is the problem of unsatisfactory heat resistance, and also it is impossible to sufficiently remove the adhesive from the contact area between electrodes and circuits since the drop of viscosity is insufficient under the practical temperature and pressure at the time of connection because of high molecular weight, such as several tens of thousands, of the material, so that a secure electrical connection can not be obtained.

(4) Another problem is the method of regeneration or renovation of faulty parts.

For example, in the case of liquid crystal display module (hereinafter referred to as LCDM), several to several tens of semiconductor chips per LCDM are connected on a transparent electroconductive glass plate (substrate) either directly or through a tape carrier (generally called TAB), and after passing a live test, the assembly is offered as a product module.

Since the live test covers the synthetic tests for semiconductor chips, connected portions, circuitries, etc., it is necessary to conduct the test on the assembly in a state close to that of the finished product.

When an abnormality is detected in the live test, the abnormal part(s), e.g., defective semiconductor chip(s), is(are) replaced with normal one(s), and the connecting operation must be performed again. In this case, it is possible to remove the abnormal part(s) relatively easily when a conventional thermo-plastic adhesive has been used since such adhesive can be lowered in its adhesive force by slight heating. In the case of curing type adhesives, however, since the connected area is firmly bonded and since the adhesive, because of its reticulated (cross-linked) molecular structure, loses little of its little lowered in adhesive force even when heated and the adhesive is hardly soluble in solvents, there are great difficulties effecting the removal of defective part(s).

For removing the defective part(s), therefore, there has been no alternative but to dip the faulty connected portion in a solvent or an acid or alkaline solution for effecting swelling or decomposition of the reticulate structure or to resort to a forcible removing means, such as scraping-off with a knife.

Use of such forcible means, however, may give damage to the normal connections and wiring around the faulty part and would also inevitably leave a part of adhesive unremoved, making it unable to obtain a reconnection with high reliability. Accordingly, renovation has been very difficult and the yield of products would be lowered, leading to an increased production cost.

SUMMARY OF THE INVENTION

In view of said problems in the prior art, the present invention is designed to provide a process for connecting circuits with markedly improved connection reliability and workability and an adhesive film used therefor.

The present invention provides a process for electrically connecting circuits by interposing an insulating adhesive between two opposing circuits in which at least one of the circuits formed on an insulating layer has a plurality of electrodes projecting from the main face, said projecting electrodes having deformability under pressure in the circuit connecting operation, said adhesive comprising (a) a liquid epoxy resin, (b) a solid resin having one or more functional groups and (c) a micro-capsule type curing agent as essential components and having a filmy form with a thickness of 50 $\mu$m or less and a volatile content of 0.5% or less, and further characterized in that the adhesive is substantially cured after the projecting electrodes have been contacted with the opposing circuits under heating and pressure at the time of connection.

The present invention also provides a process for connecting circuits, comprising the steps of forming a filmy adhesive layer composed essentially of a liquid epoxy resin, a solid resin having a functional group and a micro-capsule type curing agent on the pressure-deformable projecting electrode-formed side of a semiconductor wafer formed with a plurality of integrated circuit elements having electrodes projecting from the main face; cutting said wafer along with the adhesive layer to form chips; positioning the projecting electrodes of said chips in register with the opposing circuits on a wiring substrate with said adhesive layer interposed therebetween; and substantially curing the adhesive after contacting the projecting electrodes with the opposing circuits by applying heat and pressure to said chips and wiring substrate.

The present invention is further intended to provide a process for electrically connecting semiconductor chips by interposing a curing type adhesive between the electrodes of semiconductor chips and the circuits on a substrate, characterized in that a live test is conducted on the semiconductor chips and substrate circuits under pressure while the adhesive is still in a half-cured state, and then the adhesive is cured under heating and pressure.

It is also envisaged in this invention to provide an adhesive film usable for said connecting process, said adhesive film comprising as essential components (a) 20 to 80% by weight of a liquid epoxy resin, (b) 80 to 20% by weight of a solid resin having a functional group, (c) a microcapsule type curing agent having an average particle size of 10 $\mu$m or less, and (d) a coupling agent, and further characterized in that the film thickness is 50 $\mu$m or less, the volatile content is 0.5% or less and the hydrolytic chlorine ion concentration after curing is 20 ppm or less.

DESCRIPTION OF THE PREFERRED EMBODIMENTS

The present invention will hereinafter be described more particularly with reference to the accompanying drawings.

Figure 1A:
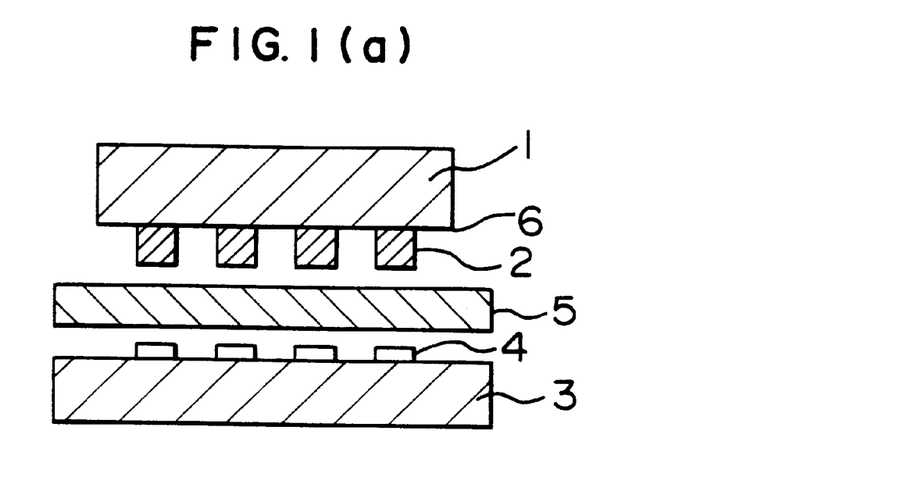
FIG. 1 is schematic sectional views showing the steps in a circuit connecting process according to the present invention.
Figure 1B:
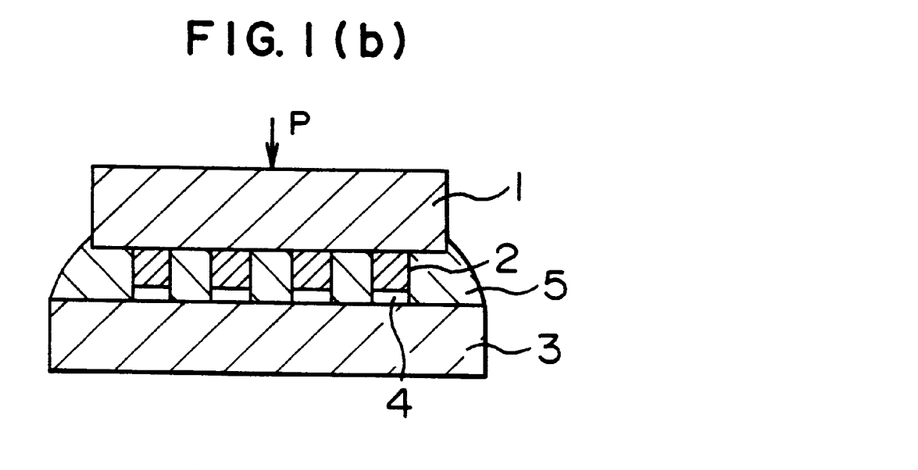
Figure 1C:
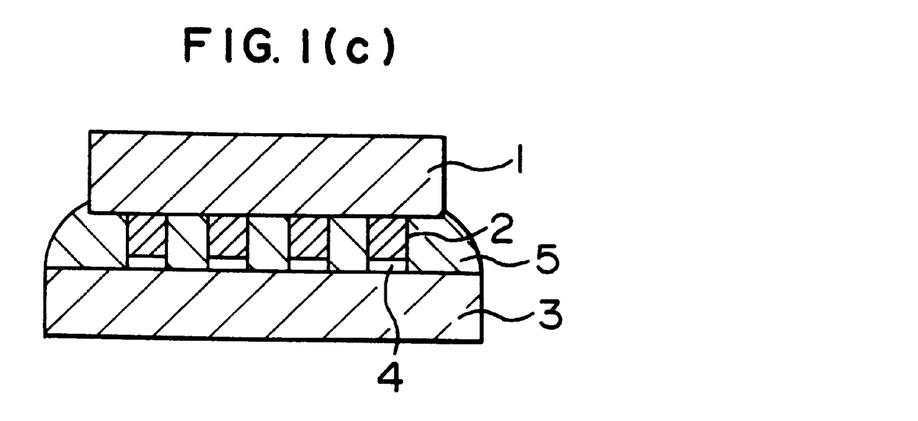
Figure 2:
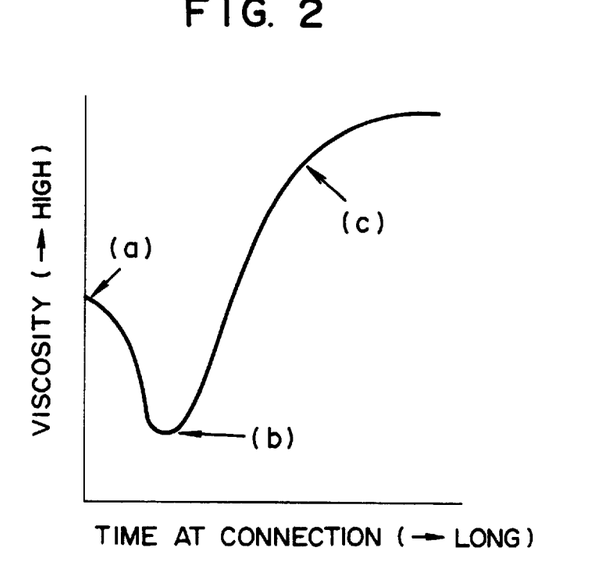
FIG. 2 is a graph showing the pattern of change of viscosity of the adhesive in the circuit connecting operation.

FIG. 1 illustrates, in schematic sectional views, the situations in a circuit connecting process according to the present invention, and FIG. 2 is a graphic illustration of the change of viscosity of the adhesive in the process. Letters (a), (b) and (c) in FIGS. 1 and 2 indicate the sequential steps in the connecting process.

Referring first to FIG. 1(*a*), there is shown a situation where a layer of an adhesive 5 was formed between the electrodes 2 projecting from the main face 6 of an electric part 1 (e.g., a semiconductor chip) and the circuits 4 provided on an insulating substrate 3 made of glass, synthetic resin or the like, and the connecting points of said projecting electrodes 2 (generally called "bumps") and the corresponding circuits 4 were positioned.

The adhesive 5 used in the above process is preferably in the form of a film which is solid at temperatures close to room temperature and has no support. But it is possible to use a separable substrate as support, and in this case, such support may be removed after it has once been attached to the side of said projecting electrodes 2 or circuits 4.

The viscosity of the adhesive in this state is as indicated by (a) in FIG. 2. This adhesive is easy to handle as it takes a solid film-like state.

As the point of (b) is reached, the projecting electrodes 2 and the corresponding circuits 4 are brought into contact with each other under heating and pressure, and the adhesive 5 lowered in viscosity by rise of temperature is removed outside of the contact area. The scatter in height of projecting electrodes from the main face is eliminated by heating and pressing in the connecting operation owing to pressure-deform-ability of said projecting electrodes 2. In this operation, it is necessary that all of the electrodes to be connected on the main face 6 of electronic part 1 are at least contacted with the corresponding circuits 4.

Regarding the heating and pressing conditions for attaining this, heating should be conducted at a temperature of 40 to 250° C. (preferably 70 to 200° C., more preferably 100 to 180° C.), while the pressure applied should be 1 to 100 kgf/cm$^2$ (preferably 5 to 70 kgf) based on the area of main face 6 of electronic part. It is desirable that the amount of pressure applied per one projecting electrode be adjusted to 1 kgf/cm$^2$ or less (preferably 0.5 kgf) for the following reason.

When the process is carried out at high temperatures, there tends to occur break or crack of electronic part 1 due to lack of heat resistance of the material of said electronic part, and when the process is conducted at low temperatures, a long time is required for curing of the adhesive, resulting in poor workability in the connecting operation. When the pressure applied is high (above the above-defined range), there is a possibility of causing mechanical break of electronic part 1, substrate 3 and/or circuits 4, while when the pressure is low, contact between electrodes 2 and corresponding circuits 4 may become insufficient, inviting unsatisfactory connection reliability.

Figure 3:
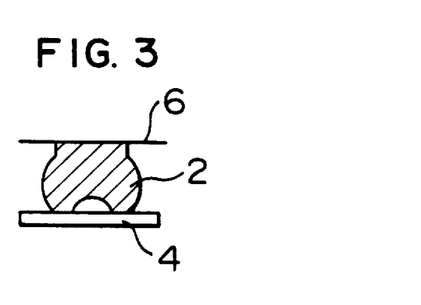
FIGS. 3 to 6 are schematic sectional views showing the states of contact with a circuit preferred in the present invention.
Figure 4:
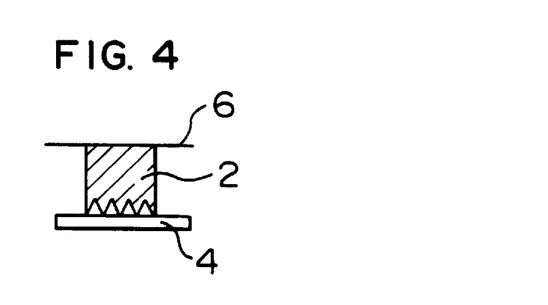

Various methods, such as mentioned below, are available for affording pressure-deformability to the projecting electrodes 2; an extendable material (for example, the materials having an elongation of 40% or more, shown in METAL DATA BOOK, p. 155, 1984, compiled by Japan Metallurgical Society and pub. by Maruzen Co., Ltd.) such as gold, solder, copper, aluminum, silver, lead, titanium or the like is used as the electrode material; fine unevenness is formed at the end of the convex electrode as shown in FIGS. 3 and 4 to reduce the portion to be pressed (deformed portion); the grain boundary structure at the time of plating is enlarged. It is preferred to use the above-described techniques in combination. Also, the electrodes may be formed with a pressure-deformable material such as a thermoplastic material and their surfaces coated with a metal.

It is also possible to employ spacer electrodes for gap adjustment obtained by making part of the projecting electrodes on the main face 6 smaller in height than the other pressure-deformable electrodes and by using a hard material for such electrodes. Such spacer electrodes are preferably provided at four diagonally opposing corners on the main face of each IC chip for allowing uniform pressing. These spacer electrodes may be either electroconductive ones or insulating dummy electrodes.

Figure 5:
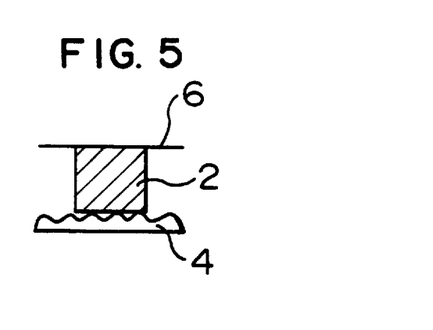

It is also effective to form unevenness on the circuit surface on the substrate side as shown in FIG. 5 as this increases the points of contact.

No specific restrictions are imposed on the arrangement of projecting electrodes on the main face 6, but it is preferred to provide on the average three or more electrodes at the periphery or on the entirety of main face 6 so that uniform pressing may be effected in the connecting operation.

A typical method for performing heating and pressing in the process of the present invention is to apply pressure while heating with a heat source (not shown) provided outside of electronic part 1 or/and substrate 3. In the step (b), the adhesive is reduced in viscosity by heating to facilitate deformation of the projecting electrodes, their contact with the corresponding circuits and removal of the adhesive, thus enabling connection with high reliability. Regarding the reduction of viscosity of the adhesive in the step of FIG. 2(b), the lower the lowest viscosity that the adhesive can have, the more desirable for the above operations. For this, it is expedient to select the adhesive film composition and the working conditions for connection so that the adhesive viscosity will become less than $1 \times 10^3$ poise (P), preferably less than $1 \times 10^2$ P.

In the above step (b), projecting electrodes 2 and corresponding circuits 4 are in an electrically conductive state as they are contacted under pressure, while the adhesive is in a half-cured state. Therefore, a live test may be conducted in this state to eliminate the faulty part(s). Also, after conducting a live test under the condition of lowest temperature at which electric conduction can be obtained between electrodes 2 and circuits 4 under pressure, the temperature may be elevated to accelerate curing of the adhesive (step (c) described later).

According to this method, regeneration (removal and reconnection) of the faulty part(s) using a curing type adhesive, which has been problematic in the prior art, can be accomplished very easily since such operation can be performed while the adhesive is in a half-cured state.

The "live test" referred to in this invention means the tests for functions and working conditions under electrification, which include, for example, conduction test and short-circuiting test.

In the case of afore-mentioned LCDM for instance, the live test covers an intermediate test of product in which the half-completed product is electrified to check for the faults in display, e.g., omission or overlapping of display lines, abnormality of brightness, and balance of coloration.

According to the present invention, since electric conduction between the electrodes of a semiconductor chip and the corresponding circuits on a substrate can be obtained by applying pressure while the adhesive is in a half-cured fluid state, it is possible to carry out the live test before the adhesive is cured.

Since the adhesive before used for the connecting operation is not advanced in reticulation, removal of faulty part and reconnection can be easily accomplished.

It is possible to perform the principal connection by conducting an adhesive curing reaction by heating or other means after passing the live test.

According to the process of the present invention, as it is of a system in which electrodes and circuits are bonded to each other with a low-viscosity adhesive, there is little fear of suffering from adhesion of dust or formation of oxide film, and it is possible to make determinations at many points at high speed under a stable condition.

The process has been described above by taking up the case of application to semiconductor chips, but the process can as well be applied to a live test for the products in the form of wafer before made into chips or to an intermediate test in mutual connection of wiring boards.

In the succeeding step (c), heating and pressing in the step (b) are continued to cause a sharp rise of viscosity of the adhesive by activating the micro-capsule type curing agent in the adhesive as shown in FIG. 2. The shorter the time of these steps (b–c), the better for the operational convenience. A time of less than 60 seconds, preferably less than 30 seconds is recommended for these steps in the practical operation. After the adhesive has been substantially cured with rise of viscosity (step (c)), pressure is removed, thereby completing the connecting operation according to the present invention.

Figure 6:
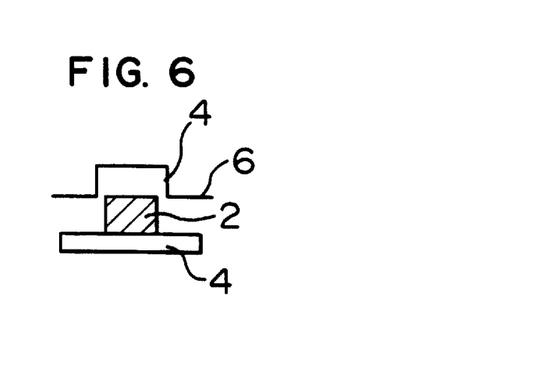

The connecting process according to this invention has been described above concerning the case of connecting an electronic part having electrodes projecting from the main face (e.g., IC chip with bumps) to a wiring substrate, but in case the electronic part surface to be connected has no projecting electrodes and presents a flat main face or is recessed, the necessary part of each circuit on the wiring substrate may be raised up to constitute a protuberant electrode to thereby effect desired connection (FIG. 6). It is also possible to provide projecting electrodes on the opposing sides of both electronic part and wiring substrate.

In the following, there will be described another embodiment of the process of the present invention which is designed capable of performing connection of chips to a substrate while preventing scattering of chips at the time of cutting of semiconductor wafer.

Semiconductor chips have generally been produced by cutting in lattice-like strips a wafer made by forming simultaneously a multiplicity of circuit patterns on a disc made of silicon single crystal or such.

For cutting the wafer, a method is popularly used in which the wafer is full-cut in the thickness direction at high speed by using a so-called dicing saw having a rotary cutting edge made of diamond or like material, because the chips made by this method have a high dimensional precision.

In this method, usually an adhesive sheet is used for preventing scattering of chips during the full-cutting operation.

A problem involved in this method is that since the dicing saw is rotated at such a high speed as several thousand to several tens of thousand r.p.m. when cutting the wafer, the adhesive sheet is required to have a high adhesive force that can stand high-speed rotation of the dicing saw, but in the succeeding step where the chips are separated from the adhesive sheet, high adhesive force makes it difficult to separate the chips, and if the chips are forcibly separated, the adhesive could stay adhering to the chip surface, jeopardizing the use of the chips for semiconductor devices which are essentially required to keep free of contaminants.

In order to eliminate said problems of the prior art, the present invention provides an improved process for connecting circuits, comprising the steps of forming an insulating adhesive layer on the electrode-formed side of a semiconductor wafer having a plurality of IC elements formed thereon; cutting said wafer together with the adhesive layer to make the adhesive-applied chips; positioning said chips on a wiring substrate with the adhesive layer interposed therebetween; and bringing the projecting electrodes into contact with the corresponding circuits under heating and pressure and then substantially curing the adhesive.

The process of this invention will be described more particularly with reference to FIGS. 7 and 8.

Figure 7:
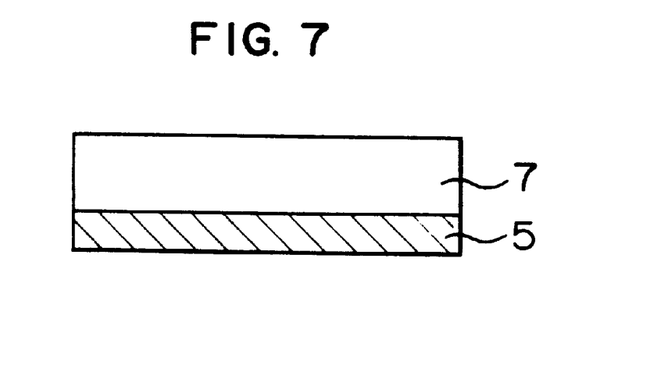
FIG. 7 is a schematic sectional view showing a state where an adhesive layer has been formed on a wafer.

FIG. 7 is a schematic sectional view illustrating a situation where an adhesive layer 5 has been formed on a wafer 7.

Said wafer has formed on its principal part a plurality of circuit patterns which are, for example, lattice-like in shape and formed with projecting electrodes which are deformable by pressing.

Adhesive layer 5 can be formed by spreading an adhesive in the form of a film and attaching it to the wafer surface by using a roll or other means. This operation is very easy to perform because of appropriate adhesiveness of the adhesive, and it is also possible to apply an auxiliary means such as heating.

The wafer formed with an adhesive layer as shown in FIG. 7 is full-cut along with the adhesive layer by using a dicing saw or other suitable means to obtain the chips with adhesive.

Figure 8:
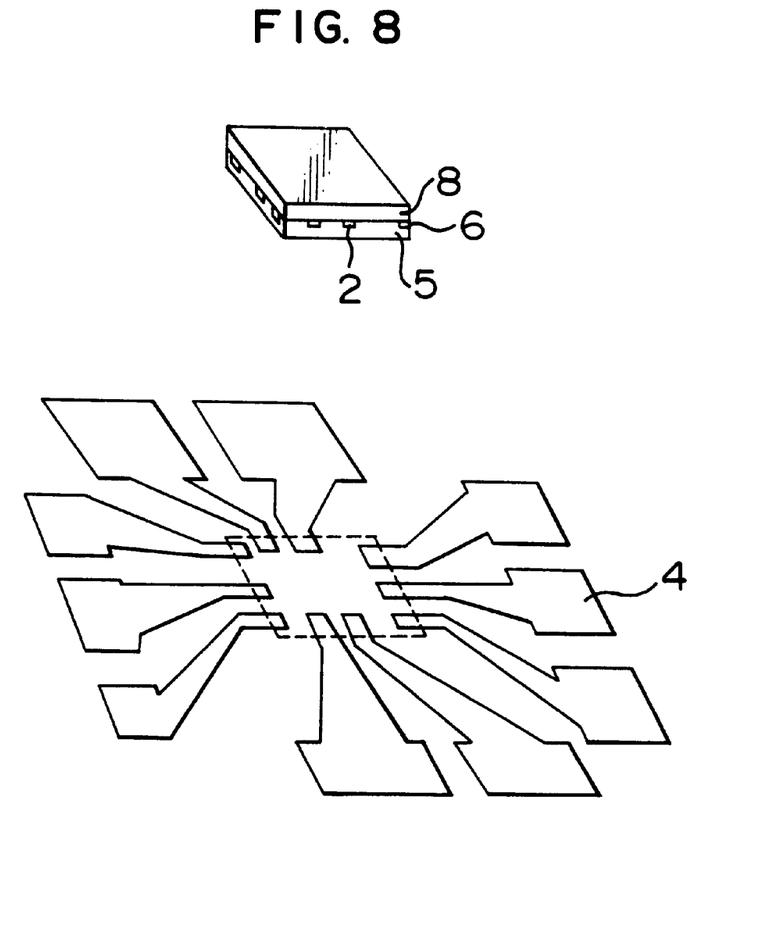
FIG. 8 is a schematic perspective view showing a state where the adhesive-applied semiconductor chips have been positioned on a circuit substrate.

FIG. 8 shows schematically in perspective a situation where an adhesive layer 5 has been formed over the electrodes 2 projecting from the main face of a bump-having IC 8 obtained in the manner described above, and said projecting electrodes 2 and the corresponding circuits 4 on the substrate 3 have been positioned and set in place. Thereafter, viscosity of the adhesive is reduced by heating and pressing, and after said electrodes 2 and circuits 4 have been sufficiently and correctly contacted with each other, the adhesive is substantially cured.

According to the present process, a single adhesive can serve both for prevention of scattering of chips at the time of cutting of wafer and for the operation of connecting the chips to a substrate. This can unnecessitate the step for separating the adhesive tape or such used at the time of chip cutting in the conventional methods and thus enables marked simplification of the working process.

The adhesive layer used in the present invention is the one taking a filmy state at normal temperature and having a thickness of 50 $\mu$m or less and a volatile content of 0.5% by weight or less. When the thickness of said adhesive layer exceeds 50 $\mu$m, it becomes necessary to remove a large volume of adhesive from the connecting electrode area by heating and pressing in the connecting operation. This makes it difficult to obtain a good connection and leads to a reduced connection reliability. When the volatile content exceeds 0.5% by weight, there takes place voluminous generation of air cells by heating and pressing in the connecting operation, resulting in a reduced connecting area of electrode and unsatisfactory connection reliability.

For the above reason, the volatile content is preferably adjusted to 0.1% or less. In the present invention, measurement of volatile content was made by pyrolysis gas chromatography at 100° C.

The thus obtained adhesive film is cured and then immersed in pure water. The treatment is preferably carried out so that the concentration of chlorine ions determined from ion chromatographic analysis of the extract after 10-hour treatment at 100° C. (hydrolytic chlorine ion concentration) will be 20 ppm or less (preferably 10 ppm or less, more preferably 5 ppm or less), because the above-defined range of chlorine ion concentration enables prevention of corrosion of the connected circuits to enhance connection reliability and can also improve the reaction rate at the time of curing of the adhesive film to realize a reduction of connecting temperature and time. An improvement of connecting workability is also provided.

As for the other properties of the adhesive after curing used in the present invention, it is desirable that the concentration of each impurity ion ($Na^+$, $K^+$, $SO_4^{--}$, etc.) is less than 20 ppm, the modulus of elasticity is below 10,000 kgf/cm$^2$ and the coefficient of thermal expansion is less than $2\times10^{-4}$/°C.

When the concentration of any impurity ion other than hydrolytic chlorine ion is higher than 20 ppm, corrosive deterioration of the connected portions will be promoted. Also, when the modulus of elasticity exceeds 10,000 kgf/cm$^2$ or when the coefficient of thermal expansion is higher than $2\times10^{-4}$/°C., the thermal stress generated at the connected portion increases to render the connected portion liable to separate under stress.

The materials for obtaining the adhesive tape used in the present invention will be described below.

(a) Liquid epoxy resin

Liquid epoxy resins usable in the present invention are the compounds having two or more epoxy groups in one molecule. It is possible to use all known types of liquid epoxy resins. Typical examples of such liquid epoxy resins are polyglycidyl ethers of polyhydric phenols such as bisphenol epoxy resins derived from epichlorohydrin and bisphenol A or bisphenol F, and epoxy novolak resins derived from epichlorohydrin and phenol novolak or cresol novolak.

Other examples of said liquid epoxy resins include polyglycidyl esters of polycarboxylic acids, alicyclic epoxy compounds, polyglycidyl ethers of polyhydric alcohols, and polyglycidyl compounds of polyvalent amines. These compounds may be partly modified in their structure with uretane or such. Also, they may be used either singly or in combination.

The term "liquid" referred to in the present invention denotes the state at normal temperature (40° C.). For example, in the case of bisphenol epoxy resin which is a preferred material for use in the present invention, such epoxy resin has a molecular weight of 500 or less and an epoxy equivalent of 270 or less. It is desirable that the epoxy resin used in this invention is high in purity, that is, reduced in concentration of impurity ions ($Na^+$, $K^+$, $SO_4^-$, etc.) or hydrolytic chlorine ions to the level below 300 ppm for each impurity, because low content of impurity ions is helpful for preventing corrosion of connected circuits and accelerating the curing reaction.

(b) Solid resin having a functional group

Another resin used in the present invention is required to be solid at room temperature (25° C.) and have a functional group such as carboxyl group, hydroxyl group, vinyl group, amino group, epoxy group and the like for improving adhesiveness and compatibility with epoxy resin. That the resin is solid at room temperature is essential for controlling fluidity and providing desired film forming properties. This resin also affords flexibility to the adhesive to improve thermal impact resistance of the connected parts.

Examples of this type of resin are solid epoxy resin having a molecular weight of 800 or more, phenoxy resin, polyvinyl acetal, polyamide, polyester, polyurethane, ethylene-vinyl acetate copolymer, acrylic esters, acrylonitrile-butadiene rubber, styrene-butadiene rubber, styrene-isoprene rubber, styrene-ethylene-butylene copolymer and the like which have been modified with a functional group such as mentioned above.

(c) Micro-capsule type curing agent

The micro-capsule type or encapsulated curing agent used in the present invention comprises the core particles of a curing agent which are substantially coated or encapsulated with a film of a polymeric material such as polyurethane, polystyrene, gelatin, polyisocyanate, etc., or an inorganic material such as calcium silicate or a thin film of a metal such as nickel, copper or the like.

The particle size is 10 μm or less, preferably 5 μm or less. The smaller the average particle size, the more desirable for effecting a uniform curing reaction.

As the curing agent forming the core, there can be used various types of known materials having reactivity with liquid epoxy resin or the functional group of solid resin or showing the action of a curing agent.

For example, as the curing agent having reactivity with epoxy resin, there can be used, for instance, aliphatic amine type, aromatic amine type, carboxylic anhydride type, thiol type, alcohol type, phenol type, isocyanate type, tertiary amine type, boron complex type, inorganic acid type, hydrazide type and imidazole type curing agents as well as the modified version thereof. Among them, tertiary amine type, boron complex salt type, hydrazide type and imidazole type are preferred as these types of curing agent allow quick curing and can minimize the necessity of giving considerations to the matters relating to chemical equivalence since these curing agents are ionic polymerization type and act catalytically. These curing agents can be used either singly or in combination.

The curing reaction is preferably completed when the connection is perfected, but it suffices if the reaction proceeds till a state is reached where the deformation of the pressure-deformable electrodes is kept between the circuits, and after-curing may be conducted in this state.

Regarding the type of encapsulated curing agent used in the present invention, the heat-activated type, namely the type which is ruptured in the coating film under a certain temperature, is preferred to the pressure-activated type because use of the former type of curing agent allows obtainment of a more uniform reaction system to improve reliability of fine connections. The heat activation temperature of the curing agent used in the present invention is preferably in the range of 40 to 250° C. When the heat activation temperature is below 40° C., the adhesive film must be stored in a cold state because otherwise there tends to occur activation of the curing agent during storage. When the heat activation temperature is above 250° C., thermal damage may be given to the parts or elements around the connected portion since a high temperature is required in the connecting operation. For these reasons, the preferred range of heat activation temperature of the curing agent used in this invention is 70 to 200° C., more preferably 100 to 180° C.

The "heat activation temperature" referred to in this invention represents the temperature at which the volume of heat generated becomes the greatest when the adhesive composition is heated from normal temperature to higher temperatures at a rate of 10° C./min by using a differential scanning calorimeter (DSC).

As the micro-capsule type curing agent such as described above, there are available and favorably usable the ones comprising particles of an imidazole derivative having their surfaces inactivated with an isocyanate compound and the ones comprising particles of an amine compound whose surfaces have been inactivated by reacting with an epoxy resin.

As for the amount ratios of said materials used for preparing an adhesive film according to the present invention, a liquid epoxy resin (a) is used in a ratio of 20 to 80% by weight, a solid resin having a functional group (b) is used in a ratio of 80 to 20% by weight, and a micro-capsule type curing agent (c) is used in a ratio of 1 to 50 parts by weight based on the adhesive composition.

When the amount ratio of the liquid epoxy resin is less than 20% by weight and that of the solid resin is more than 80% by weight, no satisfactory fluidity is obtained in the connecting operation and also the density of crosslinkage of the adhesive decreases, resulting in unsatisfactory heat resistance of the product.

The adhesive may contain where necessary an additive or additives such as tackifier, filler, ultraviolet absorber, dispersant, anti-aging agent, polymerization inhibitor, coupling agent, etc.

In case the additive contained in the adhesive is a solid material and insoluble and/or infusible in the adhesive composition, care should be exercised so that the adhesive won't adhere to the connected part of electrode to become an insulating spacer in the circuit connecting operation.

Among the additives mentioned above, coupling agent is especially recommended to use as it is effective for strengthening the adhesive interface of circuits, etc., to improve moisture resistance. As the coupling agent, known organic metal compounds such as chromium, silane, titanium, aluminum and zirconium compounds can be used. More specifically, as examples of silane coupling agents which are most commonly used among said coupling agents, there can be cited vinyl-triethoxysilane, vinyltris(β-methoxyethoxy) silane, γ-methacryloxypropyltrimethoxysilane, γ-glycidoxypropyltrimethoxysilane, β-(3,4-epoxycyclohexyl)ethyl-trimethoxysilane, N-β(aminoethyl)-γ-aminopropylmethyl-dimethoxy-silane, γ-aminopropyltriethoxysilane, N-phenyl-γ-aminopropyl-trimethoxysilane, γ-mercapto-propyltrimethoxysilane, and γ-chloro-propyltrimethoxy-silane. Among these coupling agents, those having an amino or epoxy group are preferred from the viewpoint of improvement of adhesiveness to the circuits.

The present invention has enabled electrical connection with high reliability by a simple process merely comprising application of heat and pressure by using an insulating adhesive layer with no need of applying an adhesive to a plurality of electrodes disposed at high density, owing to the specific features of the present invention that the projecting electrodes are deformable in the circuit connecting operation and that a specific adhesive is applied in the form of a film.

According to the present invention, since the adhesive contains a liquid component, it can be readily reduced in viscosity by heating in the connecting operation, and when pressure is applied in this state, the adhesive is eliminated from between the electrodes and the corresponding circuits to establish an electrical connection therebetween. Further, since the projecting electrodes are deformable under pressure, sufficient contact between electrode and circuit can be obtained, and it becomes possible to conduct a live test in this state. Moreover, as the adhesive used in this invention contains encapsulated particles of a quick-curing type heat-reactive curing agent, the adhesive composition is cured under pressure to provide a solid connection.

The curing agent used in the present invention is of a micro-capsule type as described above, so that both requirements for good keeping quality and quick curing performance are satisfied to markedly improve the workability. Also, because of small particle size which is less than 10 μm, uniform curing at fine connections is made possible.

Thus, owing to said features of the present invention—that the projecting electrodes are deformable under pressure and that the curing agent is heat-reactive, it is possible to simultaneously perform electrical connection and bonding of a great many electrodes and circuits by a simple operation of heating under pressure.

Since the adhesive used in this invention is heat-curing type, the substrate may not necessarily be a light-pervious type; various other types of substrate can be used as well.

The solid resin in the adhesive serves for improving adhesiveness and controlling film forming properties or fluidity and also acts as a flexibilizer.

Also, since the adhesive is applied in the form of a film, no coating step is required and hence workability is bettered. Further, because of uniform film thickness and a low volatile content, connection of circuits with high reliability becomes possible.

It is to be further noted that the adhesive film contains no electroconductive particles and is composed of insulating substances alone, so that this adhesive film involves no possibility of causing short-circuiting between adjacent circuits by electroconductive particles and can well adapt itself to high-resolution circuits.

The superfluous adhesive after completion of connection is forced out of the electrode section, builds up at the periphery of IC chip and is cured, so that it serves as a sealant for the connected portion. This unnecessitates the sealing step and enhances connection reliability.

Since the silane coupling agents are low in molecular weight and mostly liquid at normal temperature, the silane coupling agent in the adhesive is capable of easy flowing at the electrode contact area and promotes contact between the circuits to reduce contact resistance in the circuit connecting operation. After curing of the adhesive, said coupling agent acts as an electrode/adhesive interface reinforcing agent to contribute to the improvement of connection reliability.

The present invention will be further described below with reference to the examples thereof, in which "%" and "parts" are by weight.

EXAMPLES 1–8

(1) Preparation of adhesive film

The materials shown in Table 1 were mixed so that the involatile content of the mixtures exclusive of micro-capsule type curing agent will have the weight ratios shown in Table 2. Then each mixture was heated and melted at about 180° C.

Viscosity of each mixture at 180° C. was below 10 P. Each mixture was added gradually with toluene under cooling to obtain a 50 wt % adhesive solution. To this solution were added a specified amount (shown in Table 2) of micro-capsule type curing agent and 1 part by weight of an additive A-186 to prepare an adhesive solution.

The micro-capsule type curing agent shown in Table 1 is a commercially available masterbatch prepared by using an imidazole type curing agent as core material, coating the particle surfaces thereof with a polyurethane material to a thickness of several hundred Å to form micro-capsules of curing agent having an average particle size of 4 μm, and dispersing them in a bisphenol type liquid epoxy resin in a weight ratio of 1:2. 1.5 Mg of this masterbatch was weighed out, and the peak temperature (activation temperature) in DSC (Du Pont 1090) which was reached when heating said masterbatch at a rate of 10° C./min from 30° C. was shown in Table 1.

In the present invention, it is assumed that the amount of liquid epoxy in said masterbatch curing agent is discounted in the content of liquid epoxy in the film composition.

TABLE 1

| Trade name | Brevity code | Maker | Substance |
|---|---|---|---|
| Liquid epoxy resin | | | |
| Qautlex 1010 | 1010 | Dow Chemical Co., Ltd. | Bisphenol type (high purity; hydrolytic chlorine: less than 100 ppm) |
| Qautlex 2010 | 2010 | Dow Chemical Co., Ltd. | Phenol novolak type (high purity; hydrolytic chlorine: less than 100 ppm) |
| Solid resin | | | |
| Phenoxy PKHH | PKHH | UCC | Phenoxy resin, Mw = about 10,000 (representative functional group (rfg): hydroxyl group) |
| Epikote 1009 | 1009 | Yuka Shell Epoxy Co., Ltd. | Bisphenol type epoxy resin, MW = about 3,700 (rfg: epoxy group) |
| Butyral 3000K | 3000 | Denki Kagaku Kogyo K.K. | Acetal resin (rfg: hydroxyl group) |
| Tuftec M-1913 | 1913 | Asahi Chemical Industry Co., Ltd. | Carboxy-modified styrene-ethylene-butylene block copolymer (rfg: carboxyl group) |
| Bylon 300 | 300 | Toyobo Co., Ltd. | Polyester resin (rfg: hydroxyl group) |

TABLE 1-continued

| Trade name | Brevity code | Maker | Substance |
|---|---|---|---|
| Microcapsule type curing agent | | | |
| Novacure HX-3721 HP | 3721 | Asahi Chemical Industry Co., Ltd. | Imidazole type (activation temp.: 105° C.) Dispersant epoxy is a high-purity product. |
| Novacure HX-3741 Additive | 3741 | Asahi Chemical Industry Co., Ltd. | Imidazole type (activation temp.: 145° C.) |
| A-186 | 186 | Nippon Unicar Co., Ltd. | β-(3,4-Epoxycyclohexyl)ethyltrimethoxysilane |

TABLE 2

| | Adhesive film composition (nonvolatile content in weight ratio) | | | | | | | | | Properties | | | |
|---|---|---|---|---|---|---|---|---|---|---|---|---|---|
| | Liquid epoxy resin | | Properties | | | | | Microcapsule type curing agent | | Thickness | Volatile content | Gelation time Sec. at | Hydrolytic chlorine ion concentration |
| No. | 1010 | 2010 | PKHH | 1009 | 3000 | 1913 | 300 | 3721 | 3741 | (μm) | (%) | 180° C. | ppm |
| Example 1 | 20 | | 80 | | | | | 20 | | 25 | 0.012 | 10 | 3.3 |
| Example 2 | 65 | | 35 | | | | | 20 | | 25 | 0.008 | 5 | 0.3 |
| Example 3 | 65 | | 35 | | | | | | 20 | 25 | 0.012 | 18 | 2.5 |
| Example 4 | | 50 | 50 | | | | | 20 | | 25 | 0.010 | 15 | 2.8 |
| Example 5 | | 50 | | 50 | | | | 20 | | 25 | 0.014 | 8 | 2.1 |
| Example 6 | | 50 | | | 50 | | | 20 | | 25 | 0.012 | 9 | 3.5 |
| Example 7 | | 50 | | | | 50 | | 20 | | 25 | 0.051 | 11 | 3.0 |
| Example 8 | | 50 | | | | | 50 | 20 | | 25 | 0.10 | 12 | 4.8 |

Each of the prepared adhesive solutions was coated on a separator (a 100 μm thick Teflon film) to a predetermined thickness by a bar coater and dried at 80° C. for 20 minutes to obtain an adhesive film.

To examine the property deterioration during storage, the obtained adhesive films were subjected to a preservation test after a 24-hour heat treatment at 50° C. (corresponding to about one-month heat treatment at 25° C.), but each of the films was in a usable state and showed good keeping quality.

The properties of the above adhesive films are shown in Table 2.

The values of "thickness" shown in the table are the ones measured by using a micrometer having a precision of 1 μm. The "volatile content" denotes the rate of change of weight after treatment when a 10 mm square sample film was subjected to a thermal decomposition treatment or chromatography under the conditions of 100° C. and 3 minutes. "Gelation time" was measured by a 180° C. platen method according to JIS K-7071. "Hydrolytic chlorine ion concentration" was determined by subjecting a 100 mm square sample to one-hour heating and curing in a 150° C. thermostat, then peeling off the separator, treating the separator-removed sample in 100 ml of pure water at 100° C. for 10 hours, and analyzing the extract by an ion chromatograph (Dionex 2010i).

(2) Connection

There were prepared the wiring boards each of which had formed on a glass plate the chrome circuits having connecting terminals in correspondence to the bump disposal on a semiconductor chip (5 mm square, 0.5 mm high, having 50 μm square and 20 μm high solder bumps having their surfaces gold plated to a build-up of 0.2 μm at 200 positions along the periphery of the main face).

Said adhesive films were positioned between the bump surfaces of semiconductor chip and the corresponding circuit surfaces of wiring board. The adhesive films of Examples 2 to 8 were capable of easy provisional adhesion to the semi-conductor surface as these films had tackiness at room temperature. In the case of the film of Example 1, as it had no tackiness at room temperature, provisional adhesion was made by heating the glass circuits to about 70° C.

Separator was peeled off after said provisional adhesion, and positioning of glass circuits and bumps was conducted from the glass circuit side under a microscope. Then the assembly was subjected to 180° C./30 kgf/cm² heating and pressing for 30 seconds.

In the above process of connection, there was observed efflux of the adhesive to the periphery of the chip in the early phase of the process, while in the later stage of the process there was noted progress of bodying-up by gelation (5–18 seconds at 180° C.) of the adhesive with activation of the micro-capsule type curing agent.

(3) Evaluation

Electric conduction check-up tests of the connected products showed good connection in each product. Also, the product obtained in each of the above Examples maintained good connection even after 100 hours of pressure cracker test at 120° C.

Scanning electron microscopic observation of the cross-sections of the connected portions showed that contact between projecting electrodes and circuits has been made in a satisfactory way. It could be also confirmed that all of the projecting electrodes were equally flattened and contacted with the corresponding circuits, with the long-legged ones of the projecting electrodes being given a greater degree of deformation so that they would become flush with other electrodes.

The main constituent of projecting electrode, or bump, is a solder composed of Sn and Pb in a ratio of 60 to 40, and the melting point thereof measured by DSC was 190° C. which is close to the temperature (180° C.) applied at the time of circuit connection. Because of this fact and thin build-up of gold plating, it is considered that deformation was evoked by pressure applied in the circuit connecting operation.

The periphery of the chip was covered with the effused adhesive. It seems that the adhesive served as a moisture protector as it contained no electroconductive particles, and the adhesive film showed a sufficient moisture resistance to stand PCT without any particular sealing treatment.

The connected chips were free of dents or cracks and had good connection. This is considered due to the fact that the adhesive contained no hard substance such as electroconductive particles.

EXAMPLE 9

The adhesive film obtained in Example 8 was stuck, by making use of its tackiness and by using a rubber roller, to the pressure-deformable electrode-formed surface of a 76 mm in diameter wafer to be made into semiconductor chips used in Examples 1–8. This adhesive-applied wafer was secured to a fixed plate of a dicing device by vacuum suction and cut along with the adhesive layer by a dicing saw at a speed of 3,000 r.p.m. to form 5 mm square chips. In this operation, the dicing saw which has run through the adhesive layer reached a part of the separator, but since curing of the adhesive film has scarcely advanced, the wafer and adhesive were securely held together with a sufficient adhesive force. The large thickness (100 $\mu$m) of the separator also conducted to the prevention of scattering of chips.

Separator was removed from the adhesive-applied chips obtained in the manner described above, and the latter were subjected to the same connecting operation and evaluation as conducted in Examples 1–8. Good electrical and mechanical connections could be obtained in this Example, too.

EXAMPLE 10

(1) Preparation of adhesive

Epikote 1004 (bisphenol type epoxy resin, Mw=about 1,600, mfd. by Yuka Shell Epoxy Co., Ltd.), Nipol 1072 (carboxy-modified nitrile rubber, mfd. by Nippon Geon Co., Ltd.) and Novacure 3742 HP (a masterbatch type curing agent prepared by coating the core particles of an imidazole type curing agent with a polyurethane type material to form "micro-capsules" of curing agent having an average diameter of 2 $\mu$m, and dispersing them in a highly purified liquid bisphenol type epoxy in a weight ratio of 1:2; activation temp.: 125° C., mfd. by Asahi Chemical Industry Co., Ltd.) were blended in a ratio (by solid content) of 40:20:40, and the mixture was further added with 0.5 part of A-187 ($\gamma$-glycidoxypropyl-trimethoxysilane, mfd. by Nippon Unicar Co., Ltd.) and 0.1 part of A-1100 ($\gamma$-aminopropyltriethoxysilane, mfd. by Nippon Unicar Co., Ltd.) to prepare a 30% toluene solution.

This solution was coated on a separator by a roll coater in the same way as in Examples 1–8 and dried at 90° C. for 10 minutes to obtain a 20 $\mu$m thick adhesive film. The property evaluation of this film conducted in the same way as in Examples 1–8 gave the following results: volatile content= 0.013%; gelation time=13 seconds; hydrolytic chloride ion concentration after curing=2.9 ppm.

(2) Connection

A substrate circuit assembly was prepared by forming on a glass substrate the ITO/Cr circuits with connecting terminals in correspondence to the bump disposal on each semiconductor chip (5 mm square and 0.5 mm high, having 100 gold bumps (100 $\mu$m square and 15 $\mu$m high) along the periphery of the main face).

Said adhesive film was bonded on the substrate circuit assembly and, after separating the polypropylene film, positioning of the bumps of said semiconductor chips and the corresponding terminals on the substrate was made from the substrate circuit (glass substrate) side under a microscope, placing 10 semiconductor chips on one glass substrate. In this state, heating (80° C.) and pressing (20 kgf/cm$^2$) were conducted, and an electrical conduction test was made with a multimeter by passing an electric current of 10 $\mu$A through the substrate circuits by using a measuring probe.

(3) Regeneration

In said electrical conduction test, abnormality was detected in one of the ten semiconductor chips. So, after removing pressure, the defective part was debonded and replaced with a new chip and the same live test as described above was conducted. In this case, no abnormality was found. Debonding of the abnormal part was very easy since the adhesive was in a half-cured film-like state, and the debonded area was clean.

(4) As no abnormality was detected in the live test under pressure, the underside of the pressing plate was heated at 190° C. (at highest) for 10 seconds by an infrared irradiator. This infrared irradiator is designed to condense light from heat source (xenon lamp) through a lens and the light can be led close to the connected portion by optical fiber in a state almost free of loss, so that it is possible to raise or lower temperature in a short time.

In this Example, live test was possible as the adhesive kept at a temperature below the activation temperature of curing agent in the adhesive was pressed in a half-cured state.

Also, owing to use of an infrared irradiation and condensation system as curing means at the time of connection, it was possible to raise temperature in a short time and complete the adhesive curing reaction while maintaining the pressed state at the time of live test.

According to the present example, since the live test can be conducted by keeping the adhesive in a half-cured state, regeneration of faulty parts can be effected very easily and it becomes possible to save energy in the process and to reduce the production cost.

As described above, the present invention, which is featured by deformability of projecting electrodes and use of a specific adhesive film, enables connection of high-density circuits with high reliability.

What is claimed is:

1. A process for connecting circuits comprising the steps of:
   (a) forming a filmy adhesive layer on the surfaces of projecting electrodes of a semiconductor wafer formed with a plurality of integrated circuit elements having the pressure-deformable electrodes projecting from the main face, said adhesive comprising a liquid epoxy resin, a solid resin having a functional group and a micro-capsule type curing agent;
   (b) cutting said wafer along with the adhesive layer to form chips, and positioning the projecting electrodes of said chips with opposing circuits on a wiring substrate through the medium of the adhesive layer to set the chips in place correctly, and
   (c) substantially curing the adhesive after the projecting electrodes have been contacted with the opposing circuits by heating and pressing said chips and wiring substrate together; the protecting electrodes being contacted with the opposing circuits by heating to a temperature of 40 to 250° C. while applying a pressure in the range of from 1 to 100 kgf/cm-$^2$.

2. A process according to claim 1, wherein the filmy adhesive layer comprises as essential components (a) 20 to 80% by weight of a liquid epoxy resin, (b) 80 to 20% by weight of a solid resin having a functional group, (c) a micro-capsule type curing agent having an average particle size of 10 μm or less, and (d) a coupling agent with a thickness of 50 μm or less, a volatile content of 0.5% or less and a hydrolytic chlorine ion concentration after curing of 20 ppm or less.

3. A process according to claim 1, wherein the amount of pressure applied per one projecting electrode is adjusted to 1 kgf/cm$^2$ or less.

* * * * *